(12) United States Patent
Jin et al.

(10) Patent No.: US 10,826,016 B2
(45) Date of Patent: Nov. 3, 2020

(54) ORGANIC LIGHT-EMITTING DIODE PACKAGE, DISPLAY PANEL AND METHOD FOR MANUFACTURING THE SAME

(71) Applicant: Wuhan China Star Optoelectronics Semiconductor Display Technology Co., Ltd., Hubei (CN)

(72) Inventors: Jiangjiang Jin, Guangdong (CN); Hsiang-lun Hsu, Guangdong (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 101 days.

(21) Appl. No.: 16/125,798

(22) Filed: Sep. 10, 2018

(65) Prior Publication Data

US 2019/0326552 A1    Oct. 24, 2019

Related U.S. Application Data

(63) Continuation of application No. PCT/CN2018/087745, filed on May 22, 2018.

(30) Foreign Application Priority Data

Apr. 20, 2018 (CN) .......................... 2018 1 0361249

(51) Int. Cl.
*H01L 51/52* (2006.01)
*H01L 51/56* (2006.01)
*H01L 27/32* (2006.01)

(52) U.S. Cl.
CPC ........ *H01L 51/5253* (2013.01); *H01L 27/322* (2013.01); *H01L 27/3211* (2013.01);
(Continued)

(58) Field of Classification Search
CPC ............ H01L 51/5253; H01L 27/3246; H01L 27/3283; H01L 51/56; H01L 51/5284;
(Continued)

(56) References Cited

U.S. PATENT DOCUMENTS

2004/0212759 A1* 10/2004 Hayashi ............. H01L 51/5253
349/84
2007/0111396 A1* 5/2007 Hayashi ................. H01L 27/12
438/123
(Continued)

FOREIGN PATENT DOCUMENTS

CN     104143564 A    11/2014
CN     106024978 A    10/2016
(Continued)

*Primary Examiner* — Ahmed N Sefer

(57) ABSTRACT

The present disclosure discloses an organic light-emitting diode package, a display panel and a method for manufacturing the same. The method may include: providing a substrate comprising a baseplate, a pixel-defining layer disposed on the baseplate and a light-emitting layer disposed in an opening of the pixel-defining layer, wherein the light-emitting layer comprises an organic light-emitting diode; forming a first inorganic layer on the substrate; preparing an ultraviolet absorbing layer on the first inorganic layer; and forming a planarization layer and a second inorganic layer in sequence on the ultraviolet absorbing layer. The implementation of the present disclosure may effectively reduce the damage from external ultraviolet light to the organic light-emitting diode.

15 Claims, 5 Drawing Sheets

(52) U.S. Cl.
CPC ...... *H01L 27/3246* (2013.01); *H01L 27/3283* (2013.01); *H01L 51/5284* (2013.01); *H01L 51/56* (2013.01)

(58) Field of Classification Search
CPC ............. H01L 2251/303; H01L 27/322; H01L 27/3211
See application file for complete search history.

(56) References Cited

U.S. PATENT DOCUMENTS

| | | | |
|---|---|---|---|
| 2009/0267487 A1* | 10/2009 | Kwack | H01L 51/5256 |
| | | | 313/503 |
| 2012/0204961 A1 | 8/2012 | Kato et al. | |
| 2014/0138634 A1* | 5/2014 | Lee | H01L 51/56 |
| | | | 257/40 |
| 2014/0151656 A1* | 6/2014 | Zeng | H01L 51/5253 |
| | | | 257/40 |
| 2014/0312339 A1* | 10/2014 | Fujita | H01L 27/322 |
| | | | 257/40 |
| 2016/0268547 A1* | 9/2016 | Kim | H01L 51/5256 |
| 2017/0244064 A1* | 8/2017 | Kamiya | H01L 51/5278 |
| 2017/0299965 A1 | 10/2017 | Hashimoto et al. | |

FOREIGN PATENT DOCUMENTS

| | | | |
|---|---|---|---|
| DE | 102011079101 A1 | | 1/2013 |
| JP | H05299175 A | | 11/1993 |
| JP | 2011171187 A | | 9/2011 |
| JP | 2013105947 | * | 2/2013 |
| WO | 2005083813 A2 | | 9/2005 |

* cited by examiner

US 10,826,016 B2

ORGANIC LIGHT-EMITTING DIODE PACKAGE, DISPLAY PANEL AND METHOD FOR MANUFACTURING THE SAME

CROSS-REFERENCE TO RELATED APPLICATIONS

The present application is a continuation-application of International (PCT) Patent Application No. PCT/CN2018/087745, filed on May 22, 2018, which claims foreign priority of Chinese Patent Application No. 201810361249.3, filed on Apr. 20, 2018 in the State Intellectual Property Office of China, the entire contents of which are hereby incorporated by reference.

TECHNICAL FIELD

The present disclosure relates to a technical field of display, and particularly to an organic light-emitting diode package, a display panel and a method for manufacturing the same.

BACKGROUND

Organic Light-Emitting Diodes (OLEDs), as a new generation of display technology, attracts widespread attention because they can be made thinner and can be utilized for realizing the flexible display. Currently, one of the key factors restricting the flexible display is the packaging technology. Voltage may be supplied through the anode and the cathode of an OLED component with small molecules or macromolecules such that the OLED component may be excited to generate light. These luminescent materials are easy to dissociate in the presence of water or oxygen, and therefore OLEDs or organic solar cells need to have a passivation layer to protect the materials used in the device. In particular, for OLED devices, the water-oxygen transmission rate of the passivation layer (barrier layer) is required to be lower than 10-6 g/m$^2$d.

Currently, the focus of OLED development has gradually shifted to flexible displays with more market potential, thus proposing higher requirements on packages, and therefore the current widespread thin film encapsulation (TFE) is created. In TFE, the organic layers and the inorganic layers are generally alternately arranged. The cost and technical investment of TFE will be higher compared to that of traditional glass encapsulation methods. In addition, when the organic light-emitting material is exposed to ultraviolet light, it will be damaged, which causes the voltage to increase, and thus affecting the lifetime of the OLED device.

SUMMARY

The present disclosure provides an organic light-emitting diode package, a display panel and a method for manufacturing the same, so as to effectively reduce the damage from the external ultraviolet light to the organic light-emitting diode device.

In order to solve the above technical problem, one technical solution adopted in the present disclosure is to provide a method for manufacturing an organic light-emitting diode package. The method may include: p providing a substrate comprising a baseplate, a pixel-defining layer disposed on the baseplate and a light-emitting layer disposed in an opening of the pixel-defining layer, wherein the light-emitting layer comprises an organic light-emitting diode; forming a first inorganic layer on the substrate; preparing an ultraviolet absorbing layer on the first inorganic layer; and forming a planarization layer and a second inorganic layer in sequence on the ultraviolet absorbing layer.

In order to solve the above technical problems, another technical solution adopted in the present disclosure is to provide an organic light-emitting diode package. The organic light-emitting diode may include: a substrate comprising: a baseplate; a pixel-defining layer disposed on the baseplate and defining an opening; and a light-emitting layer disposed in the opening of the pixel-defining layer, wherein the light-emitting layer comprises an organic light-emitting diode; and an ultraviolet absorbing layer set on the substrate and covering at least a portion of the light-emitting layer.

In order to solve the above technical problems, another technical solution adopted in the present disclosure is to provide a display panel. The display panel may include: a baseplate; a pixel-defining layer disposed on the baseplate and defining an opening; a light-emitting layer disposed in the opening of the pixel-defining layer, wherein the light-emitting layer comprises an organic light-emitting diode; a first inorganic layer disposed on the pixel-defining layer and the light-emitting layer; and an ultraviolet absorbing layer arranged on the first inorganic layer and corresponding to a location of the light-emitting layer, wherein the ultraviolet absorbing layer comprises an organic monomer and titanium dioxide particles distributed in the organic monomer, and the ultraviolet absorbing layer covers at least a portion of the light-emitting layer.

In the present disclosure, an organic light-emitting diode package and a manufacturing method thereof are provides. By incorporating the ultraviolet absorbing layer containing titanium dioxide particles onto the organic light-emitting diode package, the damage from external ultraviolet light to the organic light-emitting diode device can be effectively reduced.

DETAILED DESCRIPTION

The technical solution in the embodiments of the present disclosure will be clearly and completely described below with reference to the accompanying drawings in the embodiments of the present disclosure. Obviously, the described embodiments are only a part of the embodiments of the present disclosure, not all of the embodiments. All other embodiments obtained by one with ordinary skills in the art based on the embodiments of the present disclosure without any creative efforts shall fall into the protection scope of the present disclosure.

Figure 1:
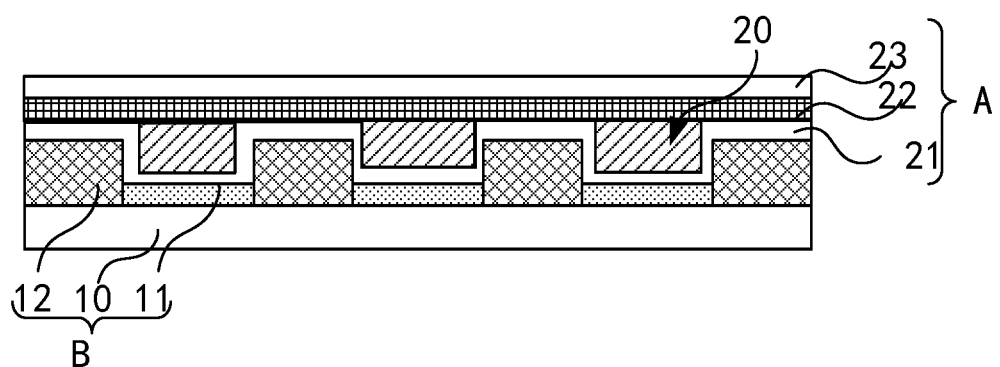
FIG. 1 is a schematic structural diagram of an organic light-emitting diode package according to an embodiment of the present disclosure.

Referring to FIG. 1, FIG. 1 is a schematic structural diagram of an organic light-emitting diode package in a first embodiment according to the present disclosure. As shown in FIG. 1, the package A in the present disclosure is formed on a substrate B. The substrate B may include a baseplate 10, a pixel-defining layer 12 provided on the baseplate 10, and a light-emitting layer 11 provided in an opening of the pixel-defining layer 12. The light-emitting layer 11 may include an organic light-emitting diode, which may specifically form a red pixel, a green pixel or a blue pixel.

Figure 2:
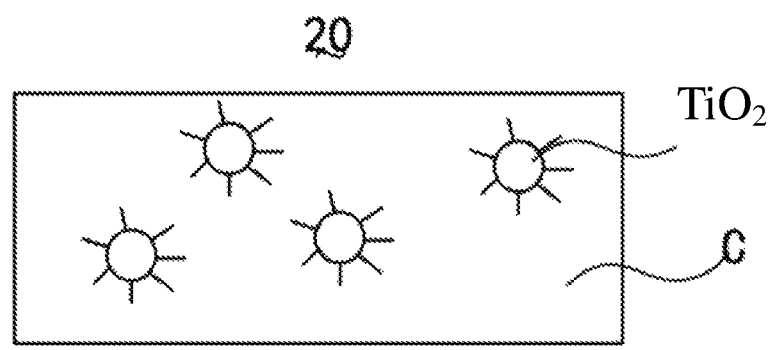
FIG. 2 is a schematic structural diagram of an ultraviolet absorbing layer according to an embodiment of the present disclosure.

Referring to FIG. 2, FIG. 2 is a schematic structural diagram of an embodiment of an ultraviolet absorbing layer according to the present disclosure. The package A in this embodiment may further include an ultraviolet absorbing layer 20 covering at least a portion of the light-emitting layer 11, and the ultraviolet absorbing layer 20 may include an organic monomer C and titanium dioxide particles ($TiO_2$) dispersed in the organic monomer C.

The titanium dioxide particles capable of absorbing ultraviolet light may be evenly distributed in the organic monomer C. The surface of the titanium dioxide particles in this embodiment may be modified with alkyl or sodium aryl benzene sulfonate. The above alkyl may be one of a saturated carbon chain, an unsaturated carbon chain, or an aromatic. The aromatic may specifically include polyphenylene ring systems such as benzene and biphenyl. Besides, the main chain may contain heteroatoms of for example bromine (Br), chlorine (Cl), silicon (Si), fluorine (F), phosphorus (P), oxygen (O), boron (B) and nitrogen (N). Optionally, in the present embodiment, the titanium dioxide particles may have a diameter in the range of 5-30 nm, and may specifically be 5 nm, 17.5 nm, 30 nm, or the like.

Optionally, the material of the organic monomer may be a low-temperature thermosetting compound, which may specifically be one of epoxy resin, acrylic, and organic silicon.

Further, the package A may further include a first inorganic layer 21 disposed between the substrate B and the ultraviolet absorbing layer 20. The material of the first inorganic layer 21 may be one of metal, nitride, oxide, and oxynitride, and may specifically be one of silicon nitride ($SiN_x$), silicon oxide ($SiO_2$), alumina ($Al_2O_3$) and zirconium oxide ($ZrO_2$). The first inorganic layer 21 may be used to block external water and oxygen and to prevent external water and oxygen from eroding the organic light-emitting diode.

With further reference to FIG. 1, the ultraviolet absorbing layer 20 in this embodiment may be formed on the first inorganic layer 21 and corresponding to the light-emitting layer 11. The light-emitting layer 11 is disposed only in the opening of the pixel-defining layer 12, and the ultraviolet absorbing layer 20 is disposed only in the opening of the pixel-defining layer 12 and corresponding to the light-emitting layer 11. The sum of the thicknesses of the ultraviolet absorbing layer 20 and the light emitting layer 11 may be smaller than that of the pixel-defining layer 12. In this embodiment, since the ultraviolet absorbing layer 20 contains titanium dioxide particles that absorb ultraviolet light, external ultraviolet light can be prevented from damaging the OLED device.

Optionally, the package A may further include a planarization layer 22 and a second inorganic layer 23 sequentially disposed on the ultraviolet absorbing layer 20. A thickness of the planarization layer 22 is in the range of 1-10 μm, and specifically be 1 μm, 5.5 μm, 10 μm, or the like. The material of the planarization layer 22 may be selected from low-temperature thermosetting or ultraviolet curable materials, which may specifically be one of polyimide, epoxy resin or organic silicone. In a specific embodiment, the planarization layer 22 may be an organic layer for buffering stress and enveloping titanium dioxide particles, which can reduce erosion from external water and oxygen to the OLED device, and can further effectively absorb damage to the OLED device from external ultraviolet light. In addition, in this embodiment, the ultraviolet absorbing layer 20 is filled on the first inorganic layer 21 and corresponding to first light-emitting layer 11. The thickness of the planarization layer 22 may be reduced correspondingly, thereby reducing the package thickness and facilitating the realization of a flexible display.

The thickness of the second inorganic layer 23 ranges from 10 nm to 1 μm, and may specifically be 10 nm, 0.5 μm, and 1 μm, etc., which is not further limited herein. The material of the second inorganic layer 23 can be one of zirconium aluminate ($ZrAl_xO_y$), graphene, alumina ($Al_2O_3$), zirconium oxide ($ZrO_2$), zinc oxide ($ZnO_2$), silicon nitride (SiNx), silicon oxide (SiOx), carbonitriding silicon (SiCN), titanium dioxide ($TiO_2$), and diamond-like carbon (DLC).

In the above embodiment, by incorporating the ultraviolet absorbing layer containing the titanium dioxide particles onto the organic light-emitting diode package, the damage from the external ultraviolet light to the organic light-emitting diode device can be effectively reduced.

Figure 3:
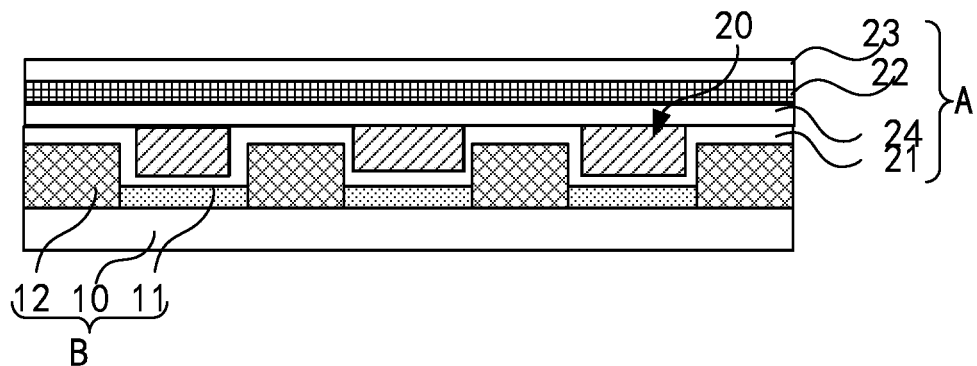
FIG. 3 is a schematic structural diagram of an organic light-emitting diode package according to another embodiment of the present disclosure.

Referring to FIG. 3, which is a schematic structural diagram of an organic light-emitting diode package according to another embodiment of the present disclosure. The package in this embodiment is similar to that of the embodiment in FIG. 1, and the similarities are not further described repeatedly. The difference is that, in this embodiment, a third inorganic layer, a planarization layer and a second inorganic layer may be formed in sequence on the ultraviolet absorbing layer and are specifically described as follows.

The package A in the present disclosure is formed on the substrate B. The substrate B may include a baseplate 10, a pixel-defining layer 12 provided on the baseplate 10, and a light-emitting layer 11 provided in an opening of the pixel-defining layer 12. The light-emitting layer 11 may include an organic light-emitting diode, which may specifically form a red pixel, a green pixel or a blue pixel.

The package A in this embodiment may further include an ultraviolet absorbing layer 20 covering at least a portion of the light-emitting layer 11, and the ultraviolet absorbing layer 20 may include a surface organic monomer and titanium dioxide particles ($TiO_2$) distributed in the organic monomer. The specific structure of the ultraviolet absorption layer 20 is described in the description of the embodiment above, and will not be repeated herein.

The package A may further include a first inorganic layer 21 disposed between the substrate B and the ultraviolet absorbing layer 20. The ultraviolet absorbing layer 20 in this embodiment is formed on the first inorganic layer 21 and corresponding to the light-emitting layer 11. In this embodiment, since the ultraviolet absorbing layer 20 contains titanium dioxide particles that absorb ultraviolet light, the titanium dioxide particles are uniformly distributed in the organic monomer, which can prevent external ultraviolet light from damaging the OLED device.

Optionally, the package A may further include a third inorganic layer 24 disposed between the planarization layer 22 and the ultraviolet absorbing layer 20. The detailed description of the planarization layer 22 and the second inorganic layer 23 may refer to the specific description in anyone of the forgoing embodiments, and will not be repeated herein. The thickness range of the third inorganic layer 24 is the same as the thickness range of the second inorganic layer 23, 10 nm to 1 μm for instance, and specifically may be 10 nm, 0.5 μm, 1 μm, or the like. The material is also the same as the material of the second organic layer 23 and may be one of zirconium aluminate ($ZrAl_xO_y$), graphene, alumina ($Al_2O_3$), zirconium oxide ($ZrO_2$), zinc oxide ($ZnO_2$), silicon nitride ($SiN_x$). One of silicon oxide ($SiO_x$), silicon carbonitride (SiCN), titanium dioxide ($TiO_2$), and diamond-like carbon (DLC).

In the above embodiment, by incorporating the ultraviolet absorbing layer containing the titanium dioxide particles onto the organic light-emitting diode package, the damage from external ultraviolet light to the organic light-emitting diode device can be effectively reduced.

Figure 4:
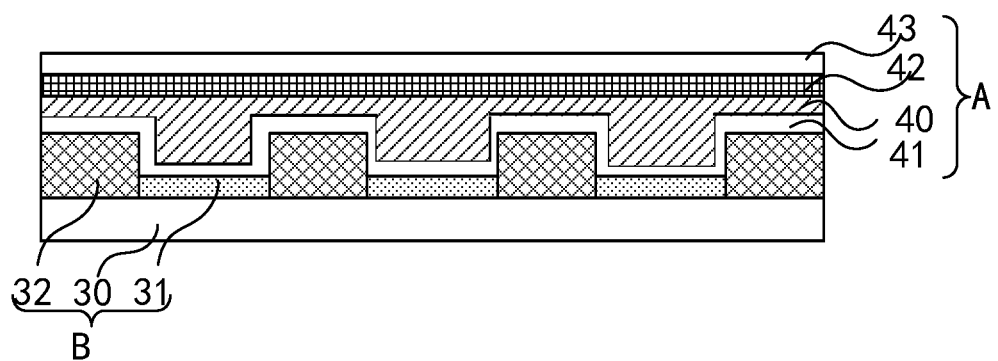
FIG. 4 is a schematic structural diagram of an organic light-emitting diode package according to another embodiment of the present disclosure.

Referring to FIG. 4, FIG. 4 is a schematic structural diagram of an organic light-emitting diode package according to another embodiment of the present disclosure. The package in this embodiment is similar to that of the embodiment in FIG. 1, and the similarities are not further described repeatedly. The difference is that the ultraviolet absorption layer in this embodiment directly covers the light-emitting layer and the pixel-defining layer, and is specifically described as follows.

As shown in FIG. 4, the package A in this embodiment is formed on the substrate B in the present disclosure. The substrate B may include a baseplate 30, a pixel-defining layer 32 provided on the baseplate 30, and a light-emitting layer 31 provided in an opening of the pixel-defining layer 32.

The package A in this embodiment may further includes an ultraviolet absorbing layer 40. The ultraviolet absorbing layer 40 may cover the pixel-defining layer 32 and the light-emitting layer 31 located behind the ultraviolet absorbing layer 40. The ultraviolet absorbing layer 40 comprises a first portion disposed on the pixel-defining layer 32 and a second portion disposed in the opening of the pixel-defining layer 32. A thickness of the second portion is greater than a thickness of the first portion so that a surface of the ultraviolet absorbing layer 40 away from the baseplate 30 is a plane. The ultraviolet absorbing layer 40 may include a surface organic monomer (not shown) and titanium dioxide particles (not shown) distributed in the organic monomer.

The package A may further include a first inorganic layer 41 disposed between the substrate B and the ultraviolet absorbing layer 40. The ultraviolet absorbing layer 40 in this embodiment is disposed on the first inorganic layer 41, and covers the light-emitting layer 31 and the pixel-defining layer 32.

Optionally, the package A may further include a planarization layer 42 and a second inorganic layer 43 in sequence formed on the ultraviolet absorbing layer 40. Details of the thickness ranges and materials of the planarization layer 42 and the second inorganic layer 43 refer to the specific description in the embodiment of FIG. 1, which will not be repeated herein.

In the above embodiment, by incorporating the ultraviolet absorbing layer containing the titanium dioxide particles onto the package of the organic light-emitting diode, the damage from the external ultraviolet light to the organic light-emitting diode device can be effectively reduced.

Figure 5:
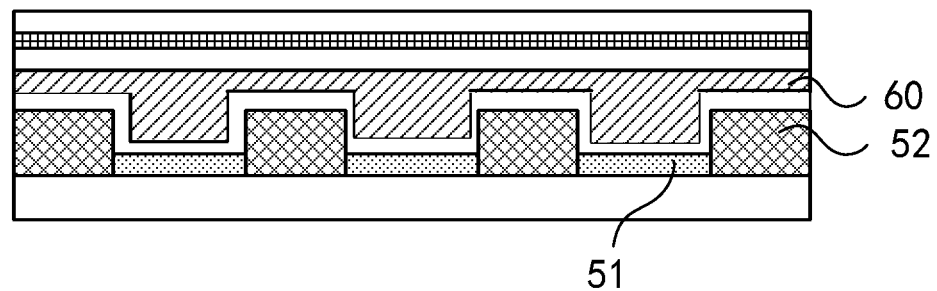
FIG. 5 is a schematic structural diagram of an organic light-emitting diode package according to another embodiment of the present disclosure.

Referring to FIG. 5, FIG. 5 is a schematic structural diagram of an organic light-emitting diode package according to another embodiment the present disclosure. The package in this embodiment is similar to that of the embodiment of FIG. 3, and the similarities are not further described repeatedly. The difference is that the ultraviolet absorbing layer 60 in this embodiment directly covers the light-emitting layer 51 and the pixel-defining layer 52, and the rest of the thickness of the package film layer and the selection of materials are similar to those in the embodiment of FIG. 3, and will not be described repeatedly herein.

The organic light-emitting diode package may be utilized in a display panel. Thus, the present disclosure further provides a display panel with an organic light-emitting diode of any one of above-described embodiments.

Figure 6:
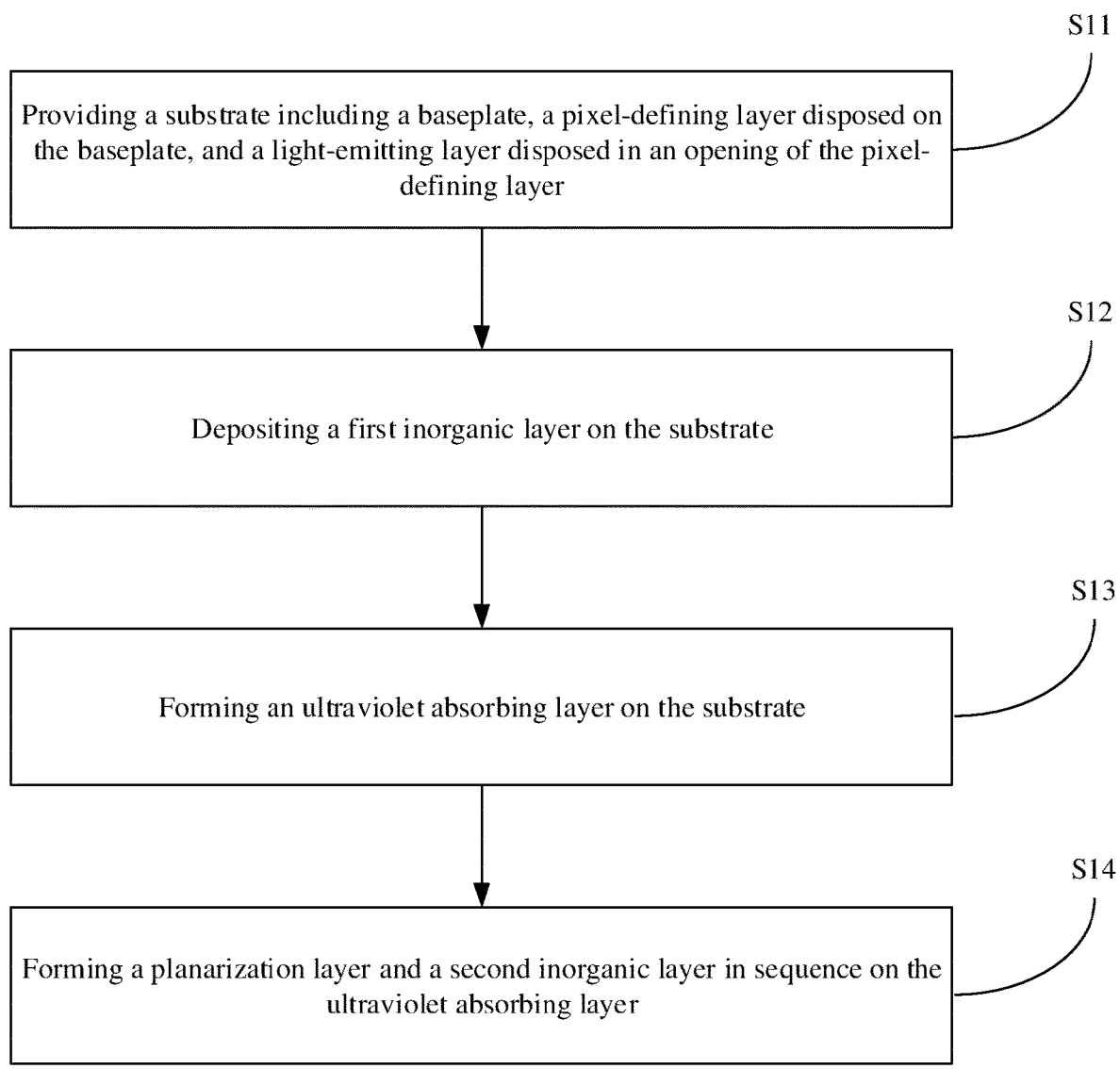
FIG. 6 is a schematic flowchart of a manufacturing method of an organic light-emitting diode package according to an embodiment of the present disclosure.

Referring to FIG. 6, FIG. 6 is a schematic flowchart of a manufacturing method of an organic light-emitting diode package according to an embodiment of the present disclosure, specifically may including the following blocks.

Figure 7:
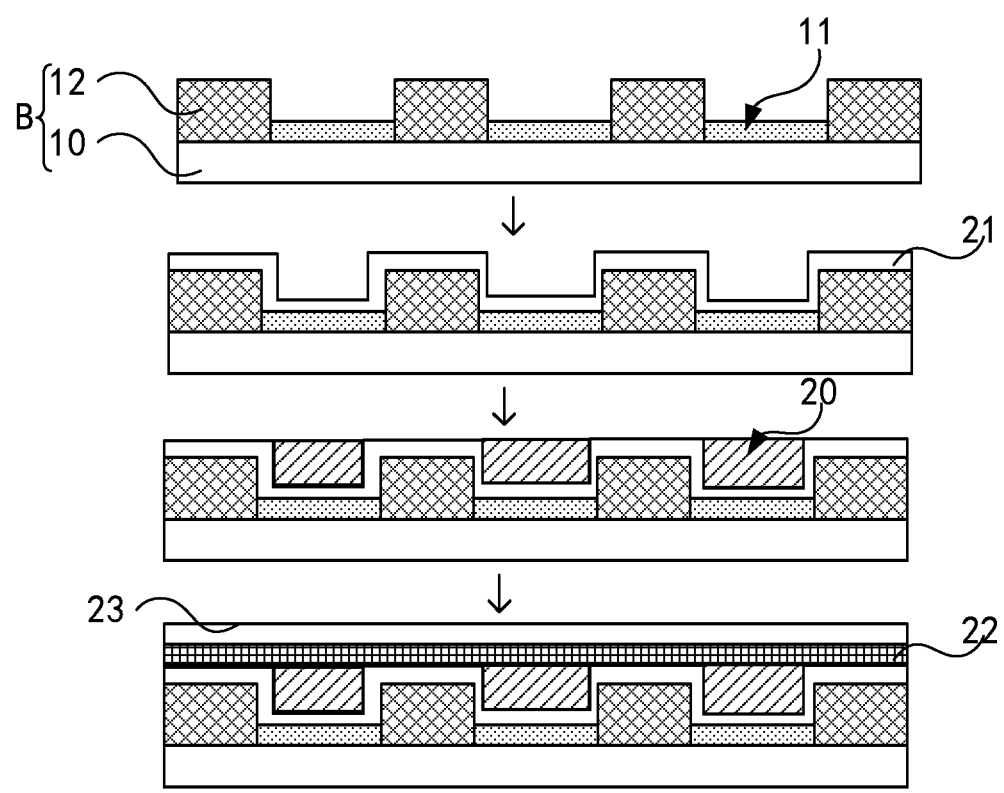
FIG. 7 shows a manufacturing process of a package according to an embodiment of the present disclosure.

S11: Providing a substrate including a baseplate, a pixel-defining layer disposed on the baseplate, and a light-emitting layer disposed in an opening of the pixel-defining layer. The light-emitting layer may include an organic light-emitting diode. Referring to FIG. 7, FIG. 7 is a schematic diagram of a manufacturing process of a package in an embodiment according to the present disclosure. In block S11, the light-emitting layer 11 and the pixel-defining layer 12 are firstly manufactured on the baseplate 10. The baseplate 10 may be made of transparent material, and may specifically be made of glass, ceramic, transparent plastic or any other materials, and will not be limited in the present disclosure.

The light-emitting layer 11 may include an organic light-emitting diode, which may specifically be pixels in three primary colors of red, green and blue.

S12: Depositing a first inorganic layer on the substrate.

A first inorganic layer 21 is deposited on the substrate B. The material of the first inorganic layer 21 may be one of metal, nitride, oxide, and oxynitride, and may specifically be one of silicon nitride ($SiN_x$), silicon oxide ($SiO_2$), alumina ($Al_2O_3$) or zirconium oxide ($ZrO_2$). The first inorganic layer 21 may be used to block external water and oxygen and to prevent external water and oxygen from eroding the organic light-emitting diode.

S13: Forming an ultraviolet absorbing layer on the substrate. The ultraviolet absorbing layer may cover at least a portion of the light-emitting layer, and the ultraviolet absorbing layer may include an organic monomer and titanium dioxide particles distributed in the organic monomer.

In this embodiment, an Ink Jet Printing (IJP) technique is used to deposit an ultraviolet absorbing layer 20 on the first inorganic layer 21 corresponding to the location of light-emitting layer 11. The ultraviolet absorbing layer 20 may include an organic layer and titanium dioxide particles distributed in the organic monomer. The titanium dioxide particles have a function of absorbing ultraviolet light and can prevent the external ultraviolet light from damaging the OLED device. The diameter of the titanium dioxide particles may range from 5 nm to 30 nm, and specifically may be 5 nm, 17.5 nm, 30 nm, or the like.

In other embodiments, the ultraviolet absorbing layer 20 may also be formed on the first inorganic layer 21 and cover the light-emitting layer 11 and the pixel-defining layer 12.

S14: Forming a planarization layer and a second inorganic layer in sequence on the ultraviolet absorbing layer.

The planarization layer 22 is formed on the ultraviolet absorption layer 20 by using one of the spin-coating technique, the ink-jet printing (IJP) technique, or the slot coating technique. The thickness of the planarization layer 22 is in a range of 1 μm to 10 μm, and specifically may be 1 μm, 5.5 μm, 10 μm, or the like. The material of the planarization layer 22 can be selected from low-temperature thermosetting or ultraviolet curable materials, which may specifically be one of polyimide, epoxy resin and organic silicone. In one embodiment, the planarization layer 22 may be an organic layer for buffering stress and enveloping titanium dioxide particles, which can reduce erosion from external water and oxygen to the OLED device, and can further effectively absorb damage on the OLED device from external ultraviolet light. In addition, in this embodiment, the ultraviolet absorbing layer 20 is filled on the first inorganic layer 21 and corresponding to the location of the first light-emitting layer 11.

Further, a second inorganic layer 23 may be deposited on the planarization layer 22 by way of atomic layer deposition (ALD), pulsed laser deposition, sputter deposition, or plasma enhanced chemical vapor deposition technique. The thickness of the second inorganic layer 23 is in the range of 10 nm to 1 μm, and may specifically, be 10 nm, 0.5 μm, 1 μm, etc., which is not further limited herein. The material of the second inorganic layer 23 can be one of zirconium aluminate ($ZrAl_xO_y$), graphene, alumina ($Al_2O_3$), zirconium oxide ($ZrO_2$), zinc oxide ($ZnO_2$), silicon nitride (SiNx), silicon oxide (SiOx), carbonitriding silicon (SiCN), titanium dioxide ($TiO_2$), and diamond-like carbon (DLC).

In the above embodiment, by incorporating the ultraviolet absorbing layer containing the titanium dioxide particles onto the organic light-emitting diode package, the damage from the external ultraviolet light to the organic light-emitting diode device can be effectively reduced.

Figure 8:
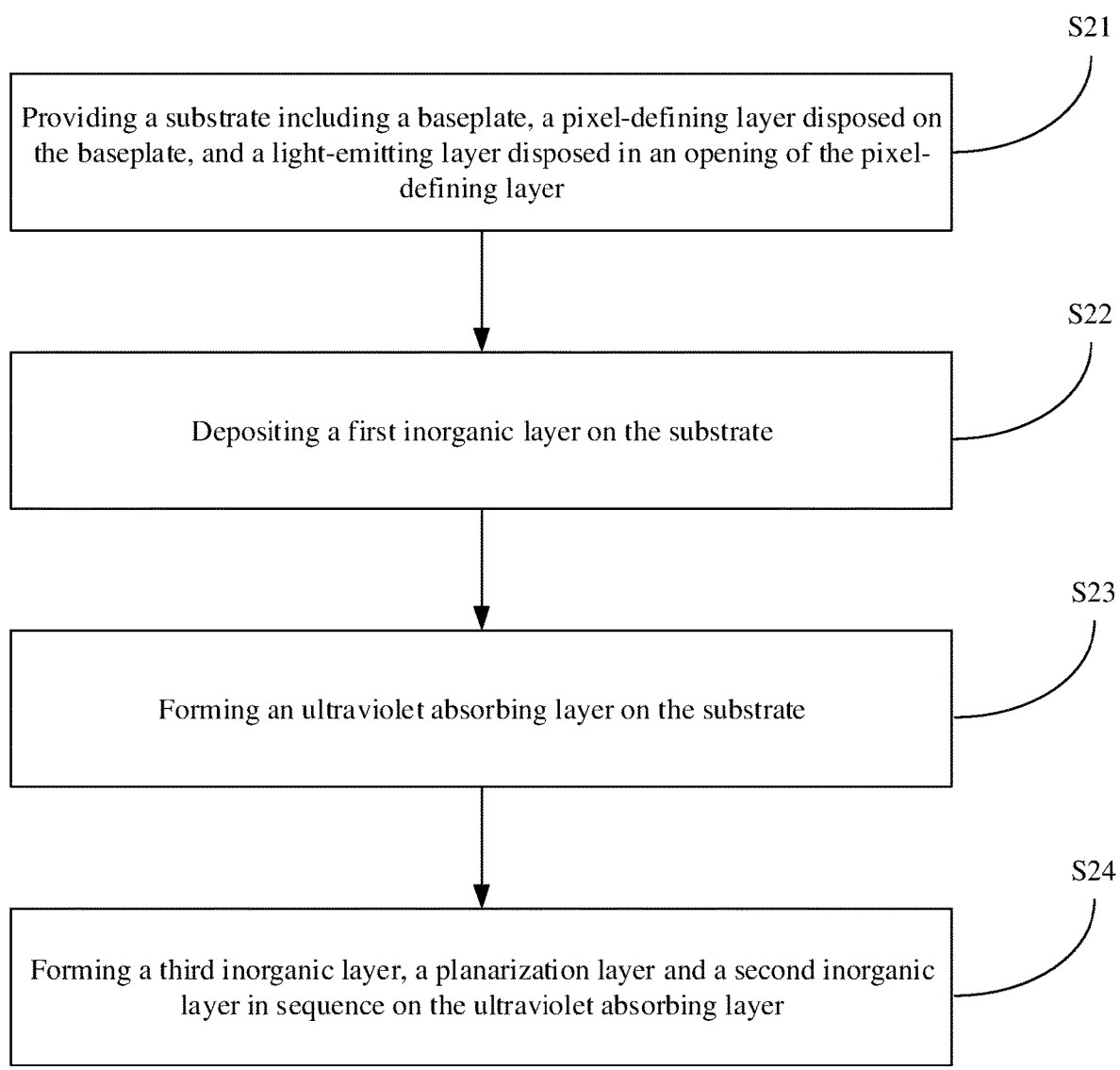
FIG. 8 is a schematic flowchart of a manufacturing method of a package according to another embodiment of the present disclosure.

Referring to FIG. 8, FIG. 8 is a schematic flowchart of a manufacturing method of a package according to the embodiment of FIG. 3 of the present disclosure, which is similar to the manufacturing method in the first embodiment, and the difference is that in this embodiment, a third inorganic layer, a planarization layer and a second inorganic layer are deposited in sequence on the ultraviolet absorbing layer. The method in this embodiment is generally similar to the first embodiment, with details as follows.

S21: Providing a substrate including a baseplate, a pixel-defining layer disposed on the baseplate, and a light-emitting layer disposed within the opening of the pixel-defining layer. The light-emitting layer may include an organic light-emitting diode.

In S22, the method may include depositing a first inorganic layer on the substrate.

In S23, the method may include manufacturing an ultraviolet absorption layer on the substrate, the ultraviolet absorption layer covering at least the light-emitting layer, the ultraviolet absorption layer including an organic monomer and titanium dioxide particles distributed in the organic monomer.

S24: Forming a third inorganic layer, a planarization layer, and a second inorganic layer in sequence on the ultraviolet absorbing layer.

In this embodiment, the thickness range of the third inorganic layer 24 may be the same as the thickness of the second inorganic layer 23 and may range from 10 nm to 1 μm, and specifically may be 10 nm, 0.5 μm, 1 μm, or the like. The material of the third inorganic layer 24 may also be the same as the material of the second organic layer 23. The manufacturing process, material and thickness of the second inorganic layer 23 and of the planarization layer 22 may refer to the specific description in the first embodiment, which will not be repeated herein.

To sum up, those skilled in the art can easily understand that the present disclosure provides an organic light-emitting diode package, a display panel and a method for manufacturing the same. By incorporating the ultraviolet absorbing layer containing the titanium dioxide particles onto the organic light-emitting diode package, the damage from the external ultraviolet light to the organic light-emitting diode device can be effectively reduced.

The above description merely illustrates some exemplary embodiments of the disclosure, which however are not intended to limit the scope of the disclosure to these specific embodiments. Any equivalent structural or flow modifications or transformations made to the disclosure, or any direct or indirect disclosures of the disclosure on any other related fields, shall all fall in the scope of the disclosure.

What is claimed is:

1. A method for manufacturing an organic light-emitting diode package, comprising:
   providing a substrate comprising a baseplate, a pixel-defining layer disposed on the baseplate and a light-emitting layer disposed in an opening of the pixel-defining layer, wherein the light-emitting layer comprises an organic light-emitting diode, the light-emitting layer is disposed only in the opening of the pixel-defining layer, the ultraviolet absorbing layer is disposed only in the opening of the pixel-defining layer and corresponding to the light-emitting layer, and a sum of thicknesses of the ultraviolet absorbing layer and the light-emitting layer is smaller than a thickness of the pixel-defining layer; or the ultraviolet absorbing layer covers the light-emitting layer and the pixel-defining layer; the ultraviolet absorbing layer comprises a first portion disposed on the pixel-defining layer and a second portion disposed in the opening of the pixel-defining layer; and a thickness of the second portion is greater than a thickness of the first portion so that a surface of the ultraviolet absorbing layer away from the baseplate is a plane;
   forming a first inorganic layer on the substrate;
   preparing an ultraviolet absorbing layer on the first inorganic layer, wherein the ultraviolet absorbing layer comprises an organic monomer and titanium dioxide particles distributed in the organic monomer; and
   forming a planarization layer and a second inorganic layer in sequence on the ultraviolet absorbing layer.

2. The method of claim 1, wherein
   a material of the organic monomer is selected from the group of epoxy resin, acrylic or organic silicone.

3. The method of claim 1, further comprising:
   before the forming the planarization layer and the second inorganic layer in sequence on the ultraviolet absorbing layer, forming a third inorganic layer on the ultraviolet absorbing layer;
   wherein the forming the planarization layer and the second inorganic layer in sequence on the ultraviolet absorbing layer comprises:
   forming the planarization layer and the second inorganic layer in sequence on the third inorganic layer.

4. The method of claim 3, wherein
   a thickness of the planarization layer is in a range of 1 μm to 10 μm, and a thickness of the second inorganic layer or the third inorganic layer is in a range of 10 nm to 1 μm.

5. The method of claim 1, wherein
   the surface of the titanium dioxide particles are modified with alkyl or sodium aryl benzene sulfonate; the above alkyl is one of a saturated carbon chain, an unsaturated carbon chain, and an aromatic; and the aromatic comprises polyphenylene ring systems.

6. An organic light-emitting diode package, comprising:
a substrate comprising:
a baseplate;
a pixel-defining layer disposed on the baseplate and defining an opening; and
a light-emitting layer disposed in the opening of the pixel-defining layer, wherein the light-emitting layer comprises an organic light-emitting diode; and
an ultraviolet absorbing layer set on the substrate and covering at least a portion of the light-emitting layer, wherein the ultraviolet absorbing layer comprises an organic monomer and titanium dioxide particles distributed in the organic monomer, the light-emitting layer is disposed only in the opening of the pixel-defining layer, the ultraviolet absorbing layer is disposed only in the opening of the pixel-defining layer and corresponding to the light-emitting layer and a sum of thicknesses of the ultraviolet absorbing layer and the light-emitting layer is smaller than a thickness of the pixel-defining layer; or the ultraviolet absorbing layer covers the light-emitting layer and the pixel-defining layer; the ultraviolet absorbing layer comprises a first portion disposed on the pixel-defining layer and a second portion disposed in the opening of the pixel-defining layer; and a thickness of the second portion is greater than a thickness of the first portion so that a surface of the ultraviolet absorbing layer away from the baseplate is a plane.

7. The organic light-emitting diode package of claim 6, wherein
a material of the organic monomer is selected from the group of epoxy resin, acrylic or organic silicone.

8. The organic light-emitting diode package of claim 6, further comprising:
a first inorganic layer disposed between the substrate and the ultraviolet absorbing layer.

9. The organic light-emitting diode package of claim 6, further comprising:
a planarization layer and a second inorganic layer arranged in sequence on the ultraviolet absorbing layer.

10. The organic light-emitting diode package of claim 9, further comprising:
a third inorganic layer set between the ultraviolet absorbing layer and the planarization layer.

11. The organic light-emitting diode package of claim 10, wherein
a thickness of the planarization layer is in a range of 1 µm to 10 µm, and a thickness of the second inorganic layer or the third inorganic layer is in a range of 10 nm to 1 µm.

12. The organic light-emitting diode package of claim 6, wherein
the surface of the titanium dioxide particles are modified with alkyl or sodium aryl benzene sulfonate; the above alkyl is one of a saturated carbon chain, an unsaturated carbon chain, and an aromatic; and the aromatic comprises polyphenylene ring systems.

13. A display panel, comprising:
a baseplate;
a pixel-defining layer disposed on the baseplate and defining an opening;
a light-emitting layer disposed in the opening of the pixel-defining layer, wherein the light-emitting layer comprises an organic light-emitting diode, wherein the ultraviolet absorbing layer covers the light-emitting layer and the pixel-defining layer; the ultraviolet absorbing layer comprises a first portion disposed on the pixel-defining layer and a second portion disposed in the opening of the pixel-defining layer; and a thickness of the second portion is greater than a thickness of the first portion so that a surface of the ultraviolet absorbing layer away from the baseplate is a plane;
a first inorganic layer disposed on the pixel-defining layer and the light-emitting layer; and
an ultraviolet absorbing layer arranged on the first inorganic layer and corresponding to a location of the light-emitting layer, wherein the ultraviolet absorbing layer comprises an organic monomer and titanium dioxide particles distributed in the organic monomer, and the ultraviolet absorbing layer covers at least a portion of the light-emitting layer.

14. The display panel of claim 13, further comprising:
a third inorganic layer, a planarization layer and a second inorganic layer arranged in sequence on the ultraviolet absorbing layer.

15. The display panel of claim 13, wherein
the surface of the titanium dioxide particles are modified with alkyl or sodium aryl benzene sulfonate; the above alkyl is one of a saturated carbon chain, an unsaturated carbon chain, and an aromatic; and the aromatic comprises polyphenylene ring systems.

* * * * *